United States Patent
Hunter et al.

(10) Patent No.: US 10,715,142 B2
(45) Date of Patent: Jul. 14, 2020

(54) LOW-VOLTAGE DIFFERENTIAL SIGNAL DRIVER AND RECEIVER MODULE WITH RADIATION HARDNESS TO 300 KILORAD

(71) Applicant: California Institute of Technology, Pasadena, CA (US)

(72) Inventors: Don J. Hunter, LaVerne, CA (US); Matthew E. King, Pasadena, CA (US); Colin McKinney, Pasadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 0 days.

(21) Appl. No.: 16/183,336

(22) Filed: Nov. 7, 2018

(65) Prior Publication Data

US 2019/0165784 A1 May 30, 2019

Related U.S. Application Data

(60) Provisional application No. 62/583,282, filed on Nov. 8, 2017.

(51) Int. Cl.
| | |
|---|---|
| H05K 1/18 | (2006.01) |
| H03K 19/003 | (2006.01) |
| H01L 23/538 | (2006.01) |
| H01L 23/00 | (2006.01) |

(52) U.S. Cl.
CPC ....... H03K 19/0033 (2013.01); H01L 23/538 (2013.01); H01L 24/48 (2013.01); H05K 1/181 (2013.01); *H01L 2224/48225* (2013.01); *H05K 2201/10378* (2013.01)

(58) Field of Classification Search
CPC ... H03K 19/0033; H01L 23/538; H01L 24/48; H01L 2224/48225; H01L 23/5389; H01L 24/49; H01L 23/52; H05K 1/181; H05K 2201/10378; H05K 1/182
See application file for complete search history.

(56) References Cited

U.S. PATENT DOCUMENTS

| | | | |
|---|---|---|---|
| 8,242,615 B2* | 8/2012 | Takahashi | H01L 21/563 257/797 |
| 8,556,523 B2* | 10/2013 | Mason | H04B 10/40 385/88 |
| 9,438,188 B2* | 9/2016 | Li | H03F 3/45071 |

* cited by examiner

*Primary Examiner* — Jung Kim
(74) *Attorney, Agent, or Firm* — Gates & Cooper LLP

(57) ABSTRACT

An LVDS device wherein driver and receiver functionalities are integrated in the same package, signals are routed from the individual driver and receiver elements inside the package such that all inputs are one side of the package, and all outputs are on the opposite side of the package, allowing for an optimized signal flow through the package. All required capacitors and resistors are integrated inside the package; no external electronic components are required. All of the above novelties also contribute to a 6:1 reduction in size compared to current state-of-the-art, for the same number of communication channels. Embodiments include a packaging topology adaptable to extreme environments, including radiation tolerant to 300 kRad (based on the die technology), so that module operational temperature is in a range of −55° C. to +100° C. and storage temperature can be as low as −184° C.

19 Claims, 20 Drawing Sheets

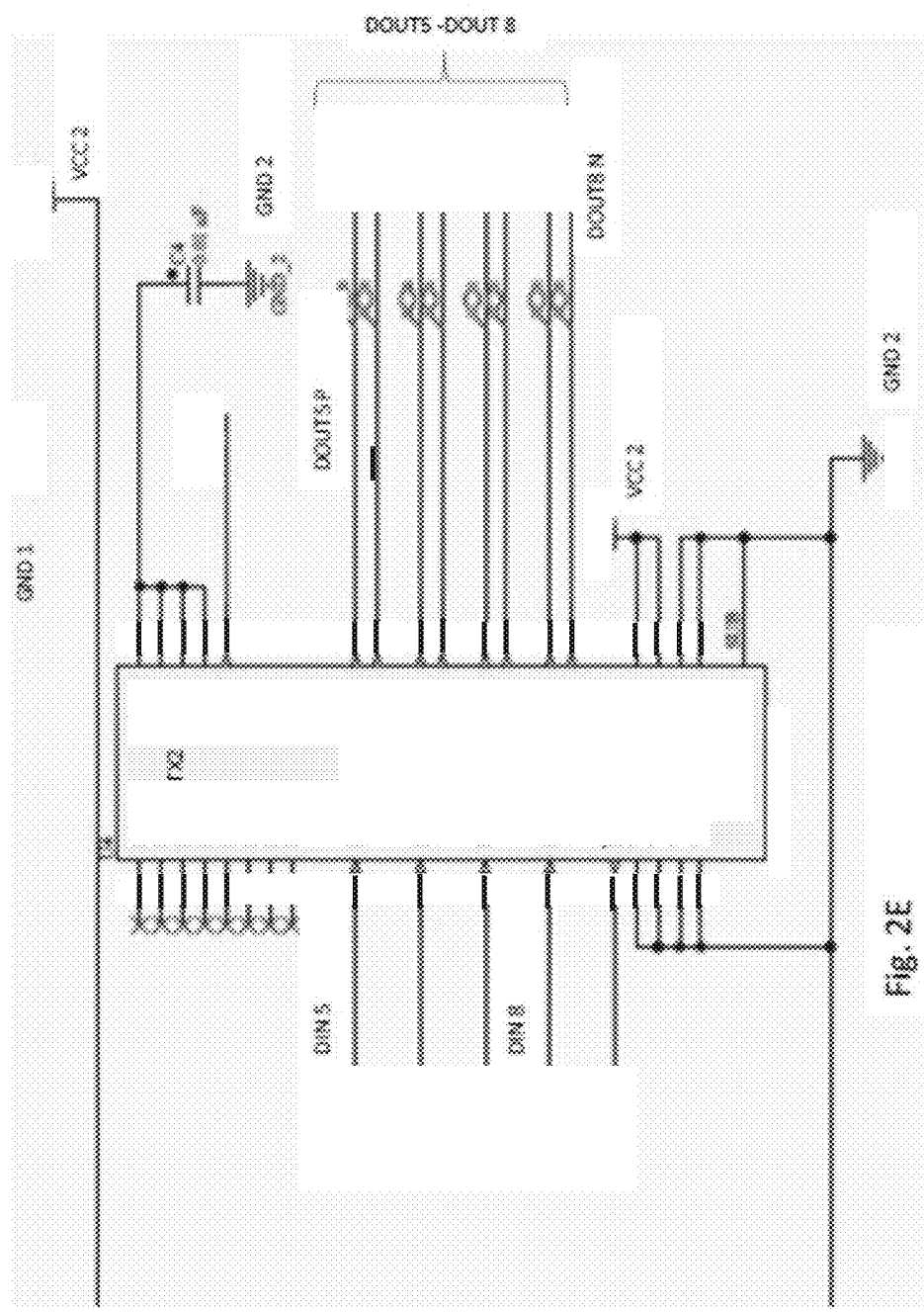

REPLACEMENT SHEETS SERIAL NO. 16/183,336

REPLACEMENT SHEETS SERIAL NO. 16/183,336

| BGA Pinout | 1 | 2 | 3 | 4 | 5 | 6 | 7 | 8 | 9 | 10 | 11 |
|---|---|---|---|---|---|---|---|---|---|---|---|
| G | GND1 | RIN1- | RIN2- | RIN3- | RIN4- | GND2 | RIN5- | RIN5- | RIN5- | RIN5- | GND2 |
| F | VCC1 | RIN1+ | RIN2+ | RIN3+ | RIN4+ | GND2 | RIN5+ | RIN6+ | RIN7+ | RIN8+ | VCC2 |
| E | VCC1 | ROUT1 | ROUT2 | ROUT3 | ROUT4 | GND2 | ROUT5 | ROUT6 | ROUT7 | ROUT8 | VCC2 |
| D | VCC1 | RX1_EN | RX1_EN | TX1_EN | TX1_EN | (NC) | RX2_EN | RX2_EN | TX2_EN | TX2_EN | VCC2 |
| C | VCC1 | DOUT1- | DOUT2- | DOUT3- | DOUT4- | GND1 | DOUT5- | DOUT6- | DOUT7- | DOUT8- | VCC2 |
| B | VCC1 | DOUT1+ | DOUT2+ | DOUT3+ | DOUT4+ | GND1 | DOUT5+ | DOUT6+ | DOUT7+ | DOUT8+ | VCC2 |
| A | GND1 | DIN1 | DIN2 | DIN3 | DIN4 | GND1 | DIN5 | DIN6 | DIN7 | DIN8 | GND2 |

Top View of BGA Package (Looking Through Component)

FIG. 4

REPLACEMENT SHEETS SERIAL NO. 16/183,336

| Item | Part Number | Supplier | Description | Value | Power | Tolerance | Reference Designator | MFR | PKG | Comments | QTY |
|---|---|---|---|---|---|---|---|---|---|---|---|
| 1 | 5962F0865102Q9A | AEROFLEX | CMOS DIFFERENTIAL LINE DRIVER | LVDS | | | U2, U4 | | DIE | | 2 |
| 2 | 5962F0865202Q9A | AEROFLEX | CMOS DIFFERENTIAL LINE RECEIVER | LVDS | | | U1, U3 | | DIE | | 2 |
| 3 | C0402C103K4RACAUTO | Digi-Key | CAP 1000PF 16V 10% X7R 0402 | 1000pF | 16V | 10.0% | C1 - C4 | KEMET | 402 | X7R | 4 |
| 4 | CRCW0201100RFKED | Digi-Key | RES SMD 100 OHM 1% 1/20W 0201 | 100OHM | 1/20W | 1.0% | R1 - R8 | VISHAY | 201 | | 8 |

FIG. 5

REPLACEMENT SHEETS SERIAL NO. 16/183,336

| Layer | Type | CU Weight | CU % | Material Description | Drills / Via Structures | Segment | Glass Style | Material Family | Dielectric constant @ 1GHz | Thickness After lamination [mil] | MRP Name |
|---|---|---|---|---|---|---|---|---|---|---|---|
| Soldermask | | | | | | | | | | 0.52 | |
| L1 | Signal | H | 50 | | | | | | | 1.50 | 9799P93 |
| | | | | 4.0 mil H/H | | Core | 106 (106/56.5%) | NelcoPolyimide | 3.5 | 4.00 | |
| L2 | Plane | H | 50 | | | | | | | 0.70 | 9799P93 |
| | | | | Press thk = 10.26 mil | | Prepreg | 2116 (52) | NelcoPolyimide | 3.7 | 10.26 | 9799PD5 |
| | | | | | | | 2116 (52) | NelcoPolyimide | 3.7 | | 9799PD5 |
| L3 | Plane | H | 50 | | | | | | | 0.70 | 9799P93 |
| | | | | 4.0 mil H/H | | Core | 106 (106/56.5%) | NelcoPolyimide | 3.5 | 4.00 | |
| L4 | Signal | H | 50 | | | | | | | 1.50 | 9799P93 |
| Soldermask | | | | | | | | | | 0.52 | |

| Customer Requirement (Over plated copper) | mil |
|---|---|
| Overall Board Thickness: | 22.0 |
| Tolerance: | +2.2/-2.2 |
| Min-Max Board Thickness: | 19.8-24.2 |

| Anticipated Board Thickness: | mil |
|---|---|
| After lamination | 20.3 |
| Over plated copper | 22.7 |

*Impedance Table*

| Layer | Impedance Requirement [ohms] | Tolerance [ohms] + | Tolerance [ohms] - | Type | Upper Ref | Lower Ref | Cust Orig Line Width [mil] | Cust Orig Spacing [mil] | Finished Line Width [mil] | Finished Spacing [mil] | Impedance Simulation [ohms] |
|---|---|---|---|---|---|---|---|---|---|---|---|
| L1 | 50 | 5.0 | 5.0 | Coated microstrip SE | | L2 | 7.09 | -- | 7.09 | -- | 50.1 |
| L1 | 100 | 10.0 | 10.0 | Coated microstrip Diff | | L2 | 3.58 | 3.90 | 3.58 | 3.90 | 100.6 |
| L4 | 50 | 5.0 | 5.0 | Coated microstrip SE | | L3 | 7.09 | -- | 7.09 | -- | 50.1 |
| L4 | 100 | 10.0 | 10.0 | Coated microstrip Diff | | L3 | 3.58 | 3.90 | 3.58 | 3.90 | 100.6 |

FIG. 7

REPLACEMENT SHEET
US Application No. 16/183,336

REPLACEMENT SHEET
US Application No. 16/183,336

LOW-VOLTAGE DIFFERENTIAL SIGNAL DRIVER AND RECEIVER MODULE WITH RADIATION HARDNESS TO 300 KILORAD

CROSS REFERENCE TO RELATED APPLICATIONS

This application claims the benefit under 35 U.S.C. Section 119(e) of commonly-assigned U.S. provisional patent application Ser. No. 62/583,282, filed on Nov. 8, 2017, by Don J. Hunter, Colin McKinney, and Matthew E. King, entitled "NEW 16 CHANNEL LOW-VOLTAGE DIFFERENTIAL SIGNALING (LVDS), 1.27 MM PITCH BALL GRID ARRAY (BGA) ELECTRONIC DEVICE, ALLOWS FOR STATE OF ART (SOA) SIZE WEIGHT AND POWER (SWAP) REDUCTION OVER CURRENT TECHNOLOGY," Client reference CIT-7041.

which application is incorporated by reference herein.

STATEMENT REGARDING FEDERALLY SPONSORED RESEARCH AND DEVELOPMENT

The invention described herein was made in the performance of work under a NASA contract NNN12AA01C, and is subject to the provisions of Public Law 96-517 (35 USC 202) in which the Contractor has elected to retain title

BACKGROUND OF THE INVENTION

1. Field of the Invention

This invention relates to a low voltage differential signal device and methods of making the same.

2. Description of the Related Art

Conventional space-qualified, low-voltage differential signaling (LVDS) drivers and receivers are only available in individual 14-pin ceramic flat packs or other similar package types, with the highest available packaging density in a quad configuration (i.e., either four drivers or four receiver channels per package). Most electronic designs employed by NASA/JPL require several channels of both transmitted and received data, and thus require several pairs of driver/receiver packages, ultimately taking up several square inches of limited printed wiring board (PWB) area.

SUMMARY OF THE INVENTION

To overcome the limitations in the art described above, and to overcome other limitations that will become apparent upon reading and understanding this specification, the present disclosure describes a Low Voltage Differential Signaling (LVDS) device according to (but not limited to) one or more of the following embodiments.

1. The LVDS device comprising a printed wiring board (PWB); a first (driver) die on the PWB, and a second (receiver) die on the PWB. The first die comprises an LVDS driver circuit, has a first side opposite a second side, all inputs to the LVDS driver circuit on the first side of the first die; and all outputs from the LVDS driver circuit on the second side of the first die. The second die comprises an LVDS receiver circuit, has a first side opposite a second side; all inputs to the LVDS receiver circuit on the first side of the second die; and all outputs from the LVDS receiver circuit on the second side of the second die.

2. The device of embodiment 1, wherein all capacitors and resistors required for operation of each of the dies are on the PWB.

3. The device of embodiment 2, wherein the capacitors include decoupling capacitors and the resistors include termination resistors.

4. The device of one or any combination of embodiments 1-3, wherein the PWB comprises an advanced organic material technology and the dies are wire bonded to the PWB.

5. The device of one or any combination of the embodiments 1-4, wherein the dies comprise bare chips attached and electrically connected directly to the PWB using wire bonding to the inputs and the outputs.

6. The device of one or any combination of the embodiments 1-5, further comprising a Ball Grid Array (BGA) electrically connected to the inputs and the outputs, wherein the dies are on a first surface of the PWB; and the BGA is on a second surface of the PWB opposite the first surface and signals are transmitted to/from the inputs and outputs and on or off the LVDS device through the BGA.

7. The device of embodiment 6, wherein wiring from each output and each input to a ball on the BGA includes no more than two changes in direction.

8. The device of one or any combination of embodiments 6-7, wherein changes in direction from each output and each input to a ball on the BGA are minimized.

9. The device of one or any combination of embodiments 1-8, wherein the LVDS device is operational at a temperature between −55° C. to +100° C., after storage at a temperature as low as −184° C., and after thermal cycling for 100 cycles between −184° C. to +85° C.

10. A circuit comprising the LVDS device of one or any combination of the embodiments 1-9, comprising a processor and a connector connected to the LVDS device; wherein single ended signals are routed between the dies and the processor; and differential signals are routed between the dies and the connector.

11. The circuit of embodiment 10, wherein the processor comprises a field programmable gate array (FPGA).

12. The LVDS device of one or any combination of embodiments 1-11, wherein the first die and the second die are connected so as to form a pair, the LVDS device further comprising a plurality of the pairs.

13. The LVDS device of embodiment 12, wherein VCC and Ground connects the dies in each pair so that the VCC for each die in the pair are connected together to the same potential and the ground for each die in the pair are connected together to the same potential.

14. The LVDS device of one or any combination of the embodiments 1-13 including two pairs, wherein each die has four inputs and four outputs and the LVDS device has 8 communication channels.

15. The LVDS device of one or any combination of the embodiments 1-14, wherein the LVDS device is at least 6 times smaller than an LVDS device wherein the LVDS driver and LVDS receiver are on separate printed wiring boards.

16. The LVDS device of one or any combination of embodiments 1-15, wherein the PWB has a surface area of 300 mm² or less.

17. A data link comprising a first station and a second station, the first and second station each including the LVDS device of one or any combination of the embodiments 1-16.

18. A device including a liquid crystal display television (LCD-TV), automotive infotainment system, industrial camera, machine vision system, notebook computer, tablet computer, mobile or cellular phone, smartphone, or other communication system comprising the LVDS of one or any combination of the embodiments 1-17. In one or more examples, the LVDS is used for communication in the device.

19. A high-speed video card, graphics card, video camera data transfer card, or general purpose computer bus connected to or including the LVDS of one or any combination of the embodiments 1-18

Embodiments of the present invention leverage a state-of-the-art 2.1D technology platform that combines 2D manufacturing with dies so as to create an LVDS system solution that allows greater packaging density and achieves equal or greater high-speed data rate performance.

In one or more examples, an octal differential line driver and octal differential line receiver is designed to support data rates in excess of 400 Mbps (200 MHz) and substrate material known as "CoreEZ®" (an advanced organic substrate technology) enables extreme electronics miniaturization, utilizing the (LVDS technology described herein.

The eight transmit and eight receive channels on exemplary devices described herein exceed that of any space-flight-qualified LVDS device currently available, while offering equal performance (data rates in excess of 100 Mbps, 3.3-V supply operation, ultra-low power dissipation). The integrated termination resistors and decoupling capacitors also offer additional saved space on the target CCA.

In one or more embodiments, a BGA pin-out of the device has been organized to allow for a more efficient routing scheme on the target PWB than can currently be accomplished using the standard pin-out on traditional LVDS drivers and receivers. In one or more examples, when viewed from the top of the package down, all receiver signals are located on the right side of the package, and all driver signals are located on the left side. Using a multilayer PWB routing scheme, single-ended signals can be routed to an FPGA (field programmable gate array), and differential signals can be routed to a connector or other subsystem using minimized trace lengths and direction changes, thus simplifying the PCB layout significantly.

BRIEF DESCRIPTION OF THE DRAWINGS

Referring now to the drawings in which like reference numbers represent corresponding parts throughout:

FIGS. 2A-2F illustrate a circuit diagram of the LVDS device according to one or more embodiments, wherein FIGS. 2B-2E are magnified views of each of the dies in FIG. 2A and FIG. 2F is a magnified view of the wiring of the inputs and outputs to the balls in the BGA. FIGS. 2B and 2E illustrate LVDS driver dies TX1 and TX2, respectively, showing inputs to TX1 (DIN1, DIN2, DIN3, and DIN4), differential outputs from TX1 (DOUT1+/−, DOUT2+/−, DOUT3+/−, DOUT4+/−), inputs to TX2 (DIN5, DIN6, DIN7, and DIN8), and differential outputs from TX2 (DOUT5+/−, DOUT6+/−, DOUT7+/−, DOUT8+/−). FIGS. 2C and 2D illustrate LVDS receivers RX1 and RX2, respectively, showing differential inputs to RX1 (RIN1+/−, RIN2+/−, RIN3+/−, RIN4+/−), outputs from RX1 (ROUT1, ROUT2, ROUT3, and ROUT4), differential inputs to RX2 (RIN5+/−, RIN6+/−, RIN7+/−, RIN8+/−), and outputs from RX2 (ROUT5, ROUT6, ROUT7, and ROUT8). GND is ground.

FIG. 4 illustrates a BGA pin layout, according to one or more embodiments. In one or more examples, single-ended signals to FPGA/differential pairs output to a connector, data rate in excess of 100 Mbps, 3.3V supply operation, and power Enable/Disable minimize quiescent current and enable low power dissipation.

FIG. 5 illustrates a parts list according to one or more embodiments.

FIG. 7 illustrates substrate PWB stackup according to one or more embodiments.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

1. Device Structure

Figure 1:
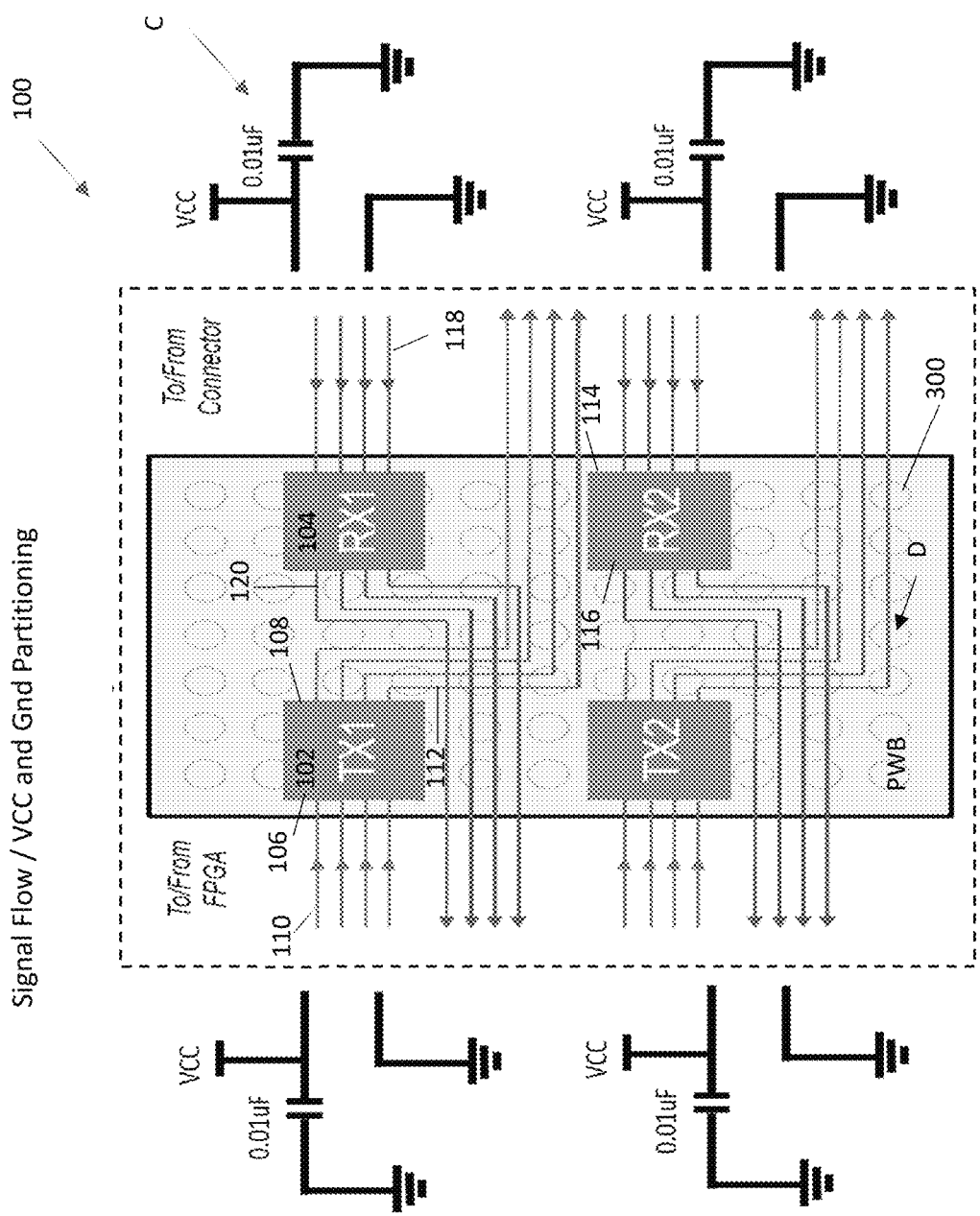
FIG. 1 illustrates a block diagram of the LVDS device according to one or more embodiments of the present invention.

FIG. 1 illustrates an LVDS device 100 comprising a printed wiring board (PWB) and pairs of dies 102, 104 on the PWB. The first die 102 (TX1, TX2) in each pair comprises or consists essentially of an LVDS driver circuit, the first die having a first side 106 opposite a second side 108 such that all inputs 110 to the LVDS driver circuit are on the first side 106 of the first die and all outputs 112 from the LVDS driver circuit are on the second side 108 of the first die. The second die 104 (RX1, RX2) in each pair comprises or consists essentially of an LVDS receiver circuit, the second die also having a first side 114 opposite a second side 116 such that all inputs 118 to the LVDS receiver circuit are on the first side of the second die and all outputs 120 from the LVDS receiver circuit are on the second side of the second die.

FIGS. 2A-2E illustrate an LVDS device circuit diagram, showing all capacitors C, e.g., C1, C2, C3, C4 (including decoupling capacitors) and all resistors R, e.g., R1, R2, R3, R4 (including termination resistors) required for operation of each of the dies 102, 104 are on the PWB. FIG. 2 further illustrates the first die and the second die are connected so as to form a pair P. VCC and Ground connects the dies in each pair so that the VCC for each die in the pair are connected together to the same potential and the ground for each die in the pair are connected together to the same potential.

In the examples shown in FIGS. 1 and 2, the LVDS device includes two pairs (each pair including a receiver die and a driver die), wherein each die has four inputs and four outputs so that the LVDS device has 8 communication channels. However, the LVDS can have any number of pairs (e.g., the LVDS device may include one or more pairs).

Figure 2A:
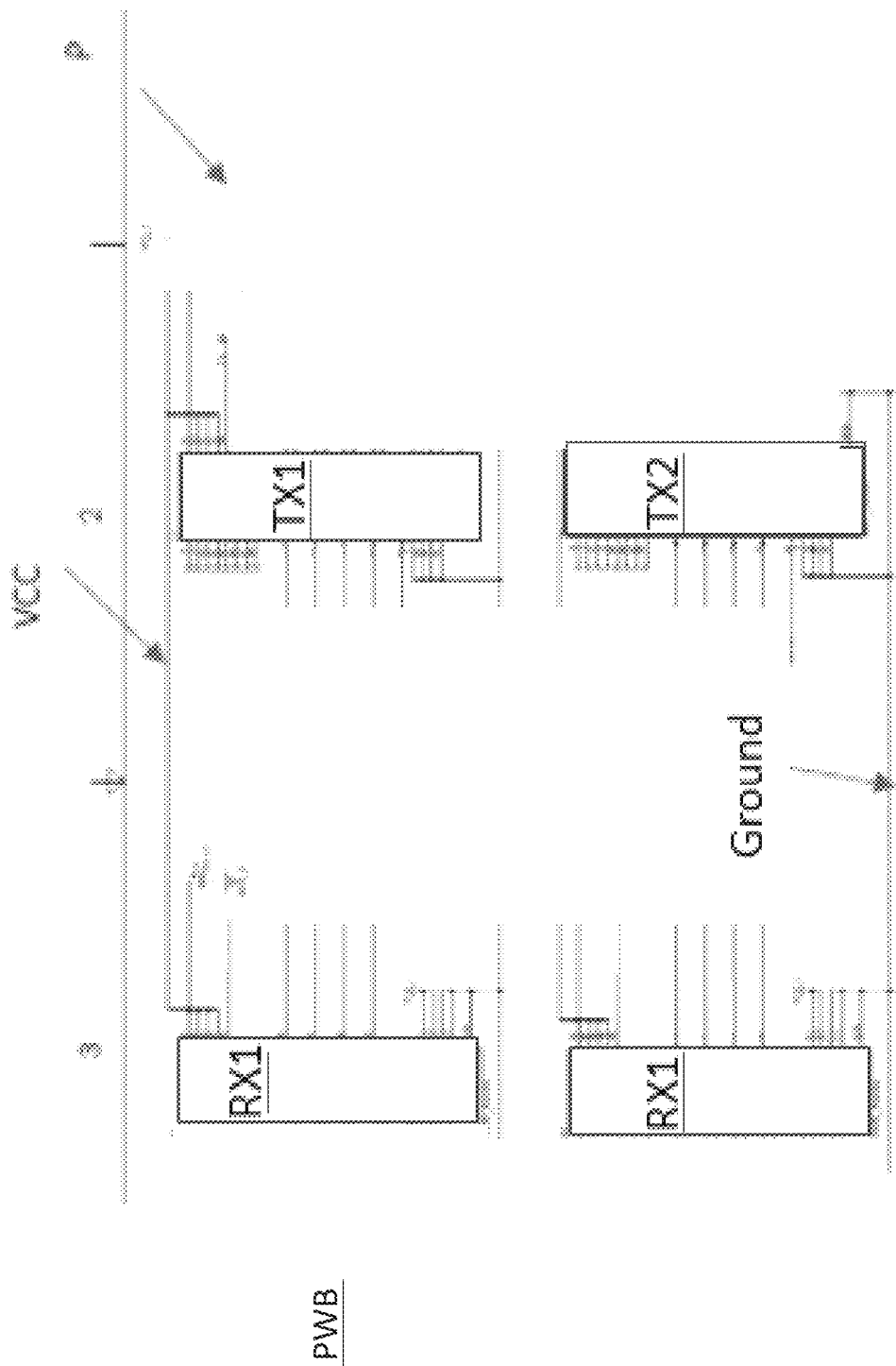
Figure 2B:
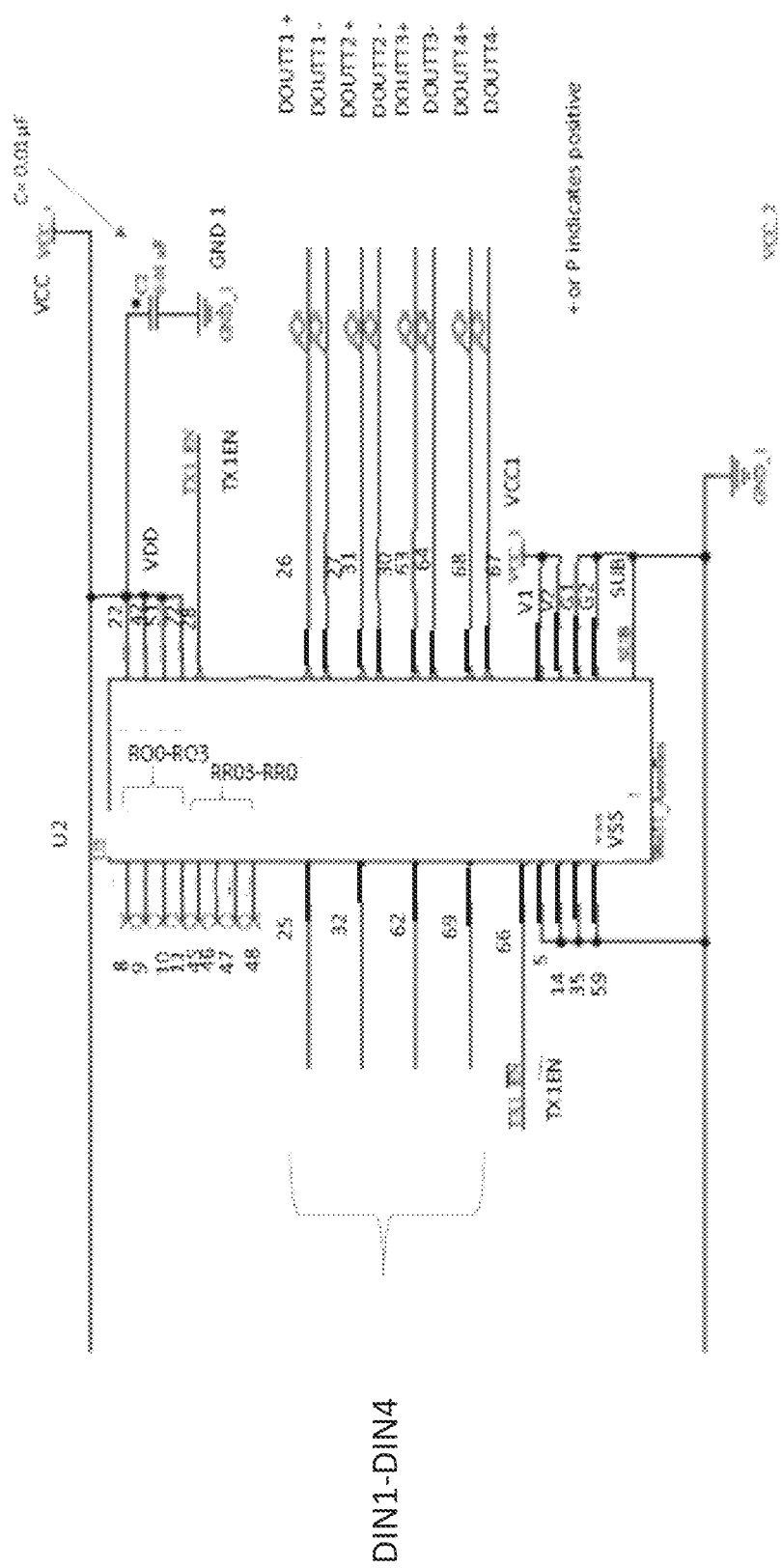
Figure 2C:
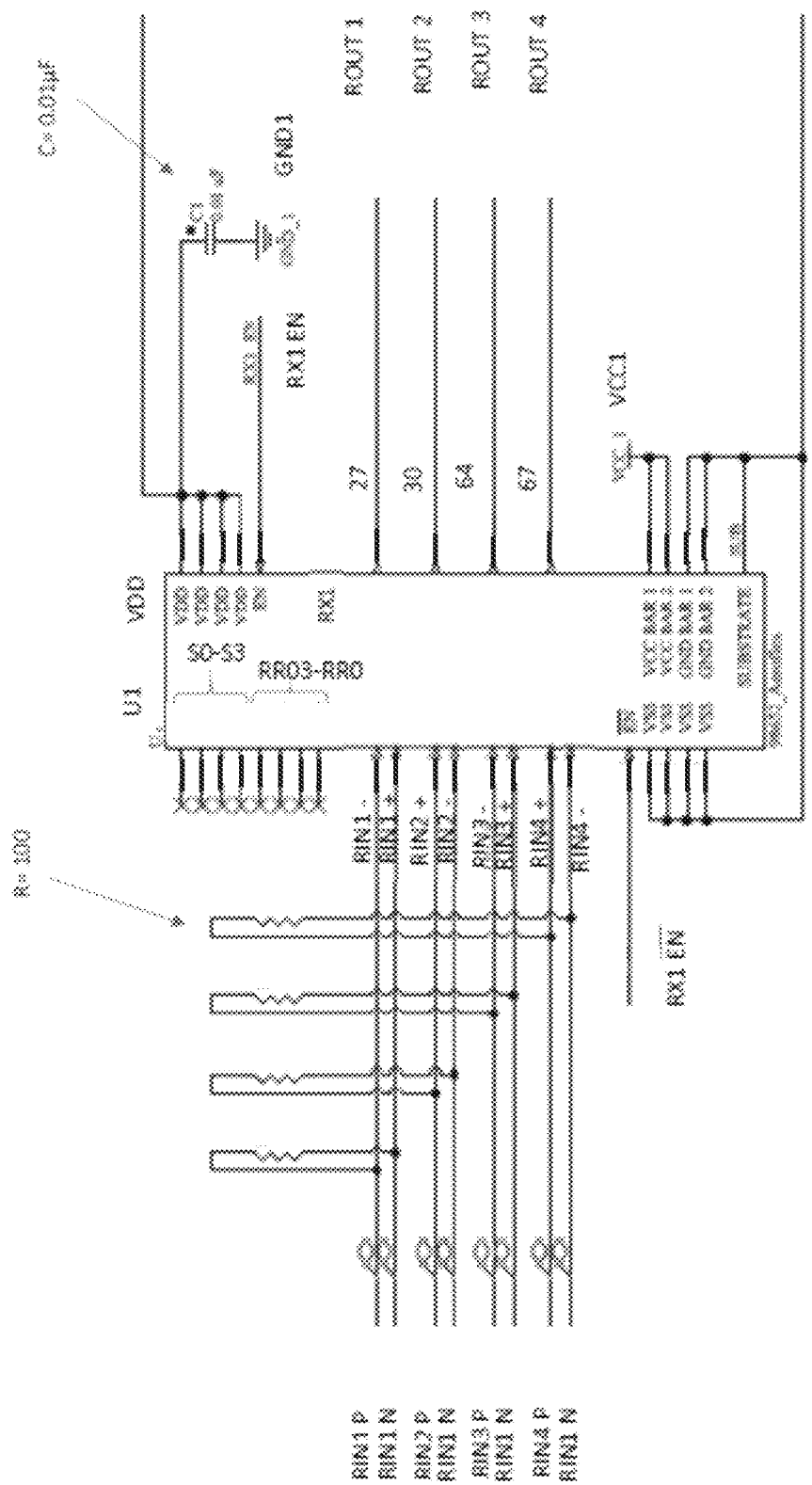
Figure 2D:
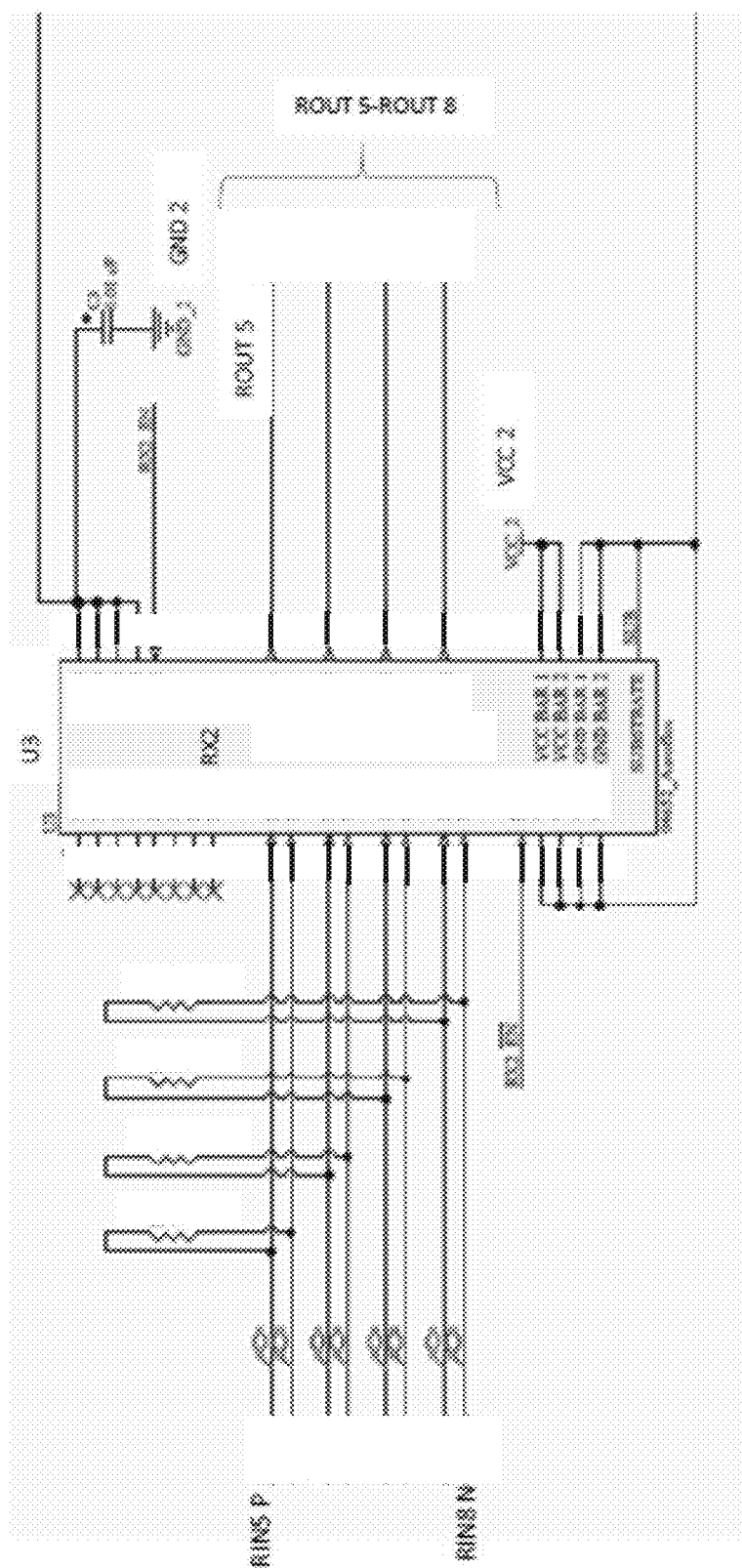
Figure 2F:
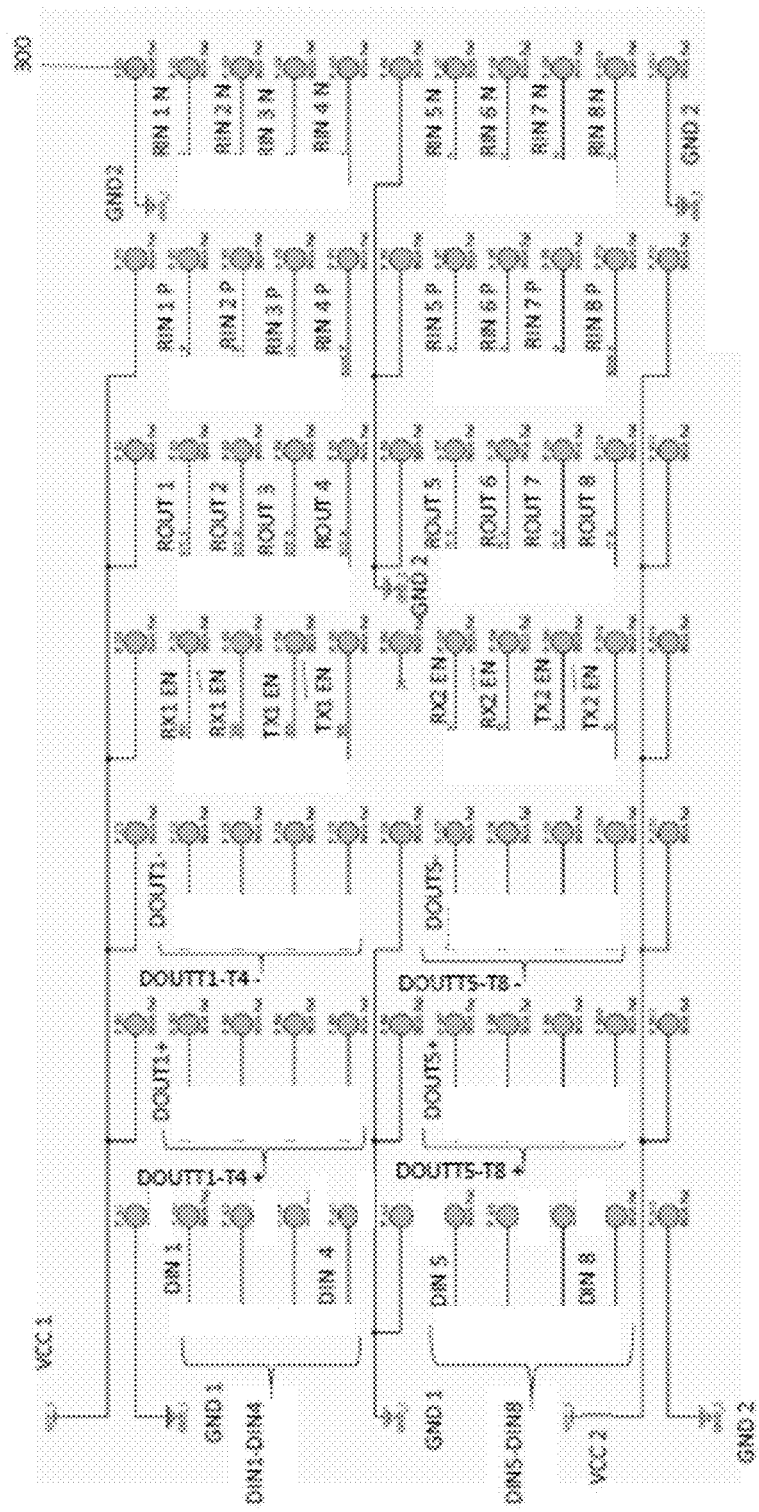
Figure 3:
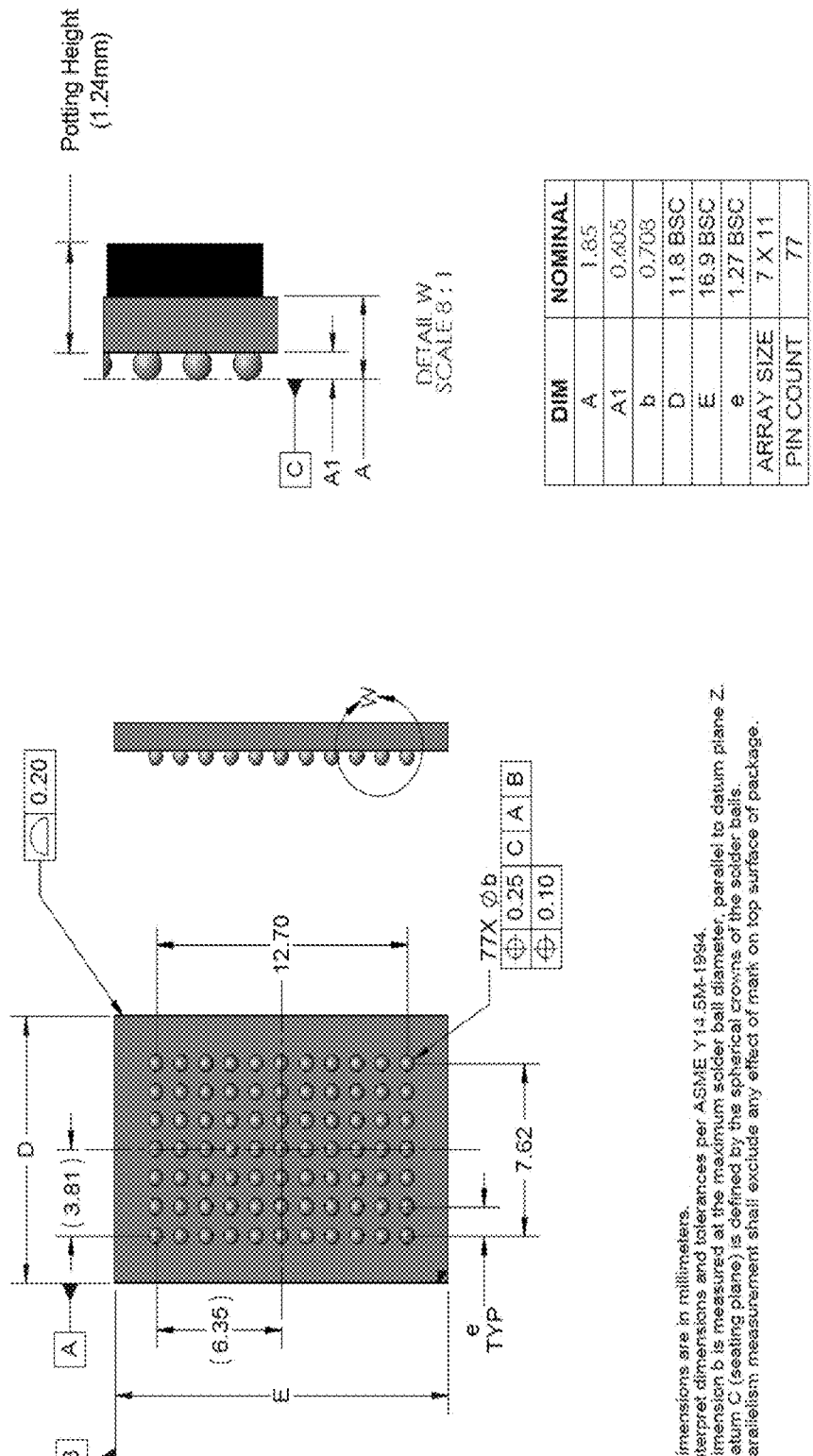
FIG. 3 illustrates a package dimensions and BGA on an underside of the PWB, according to one or more embodiments.

FIG. 2F and FIG. 3 illustrate the LVDS may further comprise a Ball Grid Array (BGA) electrically connected to the inputs 110, 118 and the outputs 112, 120, wherein the dies TX1, TX2, RX1, RX2, 102, 104 are on a first surface A of the PWB; and the BGA is on a second surface B (underside) of the PWB opposite the first surface and signals are transmitted to/from the inputs 110, 118 and outputs 112, 120 and on or off the LVDS device 100 through balls 300 on the BGA.

FIG. 4 illustrates an example BGA pin layout, wherein:
DIN=Driver single-ended input
DOUT+/−=Driver differential output
TX_EN=Driver enable signal
RIN+/−=Receiver differential input
ROUT=Receiver single-ended output
RX_EN=Receiver enable signal.

2. Example Electrical Internal Routing Characteristics

Netlist
$PACKAGES
0201 ! 0201; R1 R2 R3 R4 R5 R6 R7 R8
0402 ! 0402; C1 C2 C3 C4
'98651-DIEA' ! '98651-DIEA'; U2 U4
'98652-DIEA' ! '98652-DIEA'; U1 U3
BGA_77 ! BGA_77; U5
$NETS
DIN1; U2.25 U2.25A U5.C2
DIN2; U2.32 U2.32A U5.C3
DIN3; U2.62 U2.62A U5.C4
DIN4; U2.69 U2.69A U5.C5
DIN5; U4.25 U4.25A U5.C7
DIN6; U4.32 U4.32A U5.C8
DIN7; U4.62 U4.62A U5.C9
DIN8; U4.69 U4.69A U5.C10
DOUT1_N; U2.27 U2.27A U5.A2
DOUT1_P; U2.26 U2.26A U5.B2
DOUT2_N; U2.30 U2.30A U5.A3
DOUT2_P; U2.31 U2.31A U5.B3
DOUT3_N; U2.64 U2.64A U5.A4
DOUT3_P; U2.63 U2.63A U5.B4
DOUT4_N; U2.67 U2.67A U5.A5
DOUT4_P; U2.68 U2.68A U5.B5
DOUT5_N; U4.27 U4.27A U5.A7
DOUT5_P; U4.26 U4.26A U5.B7
DOUT6_N; U4.30 U4.30A U5.A8
DOUT6_P; U4.31 U4.31A U5.B8
DOUT7_N; U4.64 U4.64A U5.A9
DOUT7_P; U4.63 U4.63A U5.B9
DOUT8_N; U4.67 U4.67A U5.A10
DOUT8_P; U4.68 U4.68A U5.B10
GND_1; C1.1 C2.1 U1.5 U1.9 U1.11 U1.14 U1.35 U1.45
    U1.48 U1.59 U1.11A, U1.14A U1.35A U1.45A U1.48A
    U1.59A U1.5A U1.9A U2.5 U2.9 U2.11, U2.14 U2.35
    U2.45 U2.48 U2.59 U2.11A U2.14A U2.35A U2.45A
    U2.48A, U2.59A U2.5A U2.9A U5.A1 U5.A6 U5.B6
    U5.C6 U5.G1
GND_2; C3.1 C4.1 U3.5 U3.9 U3.11 U3.14 U3.35 U3.45
    U3.48 U3.59 U3.11A, U3.14A U3.35A U3.45A U3.48A
    U3.59A U3.5A U3.9A U4.5 U4.9 U4.11, U4.14 U4.35
    U4.45 U4.48 U4.59 U4.11A U4.14A U4.35A U4.45A
    U4.48A, U4.59A U4.5A U4.9A U5.A11 U5.E6 U5.F6
    U5.G6 U5.G11
RIN1_N; R1.2 U1.25 U1.25A U5.G2
RIN1_P; R1.1 U1.26 U1.26A U5.F2
RIN2_N; R2.2 U1.32 U1.32A U5.G3
RIN2_P; R2.1 U1.31 U1.31A U5.F3
RIN3_N; R3.2 U1.62 U1.62A U5.G4
RIN3_P; R3.1 U1.63 U1.63A U5.F4
RIN4_N; R4.2 U1.69 U1.69A U5.G5
RIN4_P; R4.1 U1.68 U1.68A U5.F5
RIN5_N; R5.2 U3.25 U3.25A U5.G7
RIN5_P; R5.1 U3.26 U3.26A U5.F7
RIN6_N; R6.2 U3.32 U3.32A U5.G8
RIN6_P; R6.1 U3.31 U3.31A U5.F8
RIN7_N; R7.2 U3.62 U3.62A U5.G9
RIN7_P; R7.1 U3.63 U3.63A U5.F9
RIN8_N; R8.2 U3.69 U3.69A U5.G10
RIN8_P; R8.1 U3.68 U3.68A U5.F10
ROUT1; U1.27 U1.27A U5.E2
ROUT2; U1.30 U1.30A U5.E3
ROUT3; U1.64 U1.64A U5.E4
ROUT4; U1.67 U1.67A U5.E5
ROUT5; U3.27 U3.27A U5.E7
ROUT6; U3.30 U3.30A U5.E8
ROUT7; U3.64 U3.64A U5.E9
ROUT8; U3.67 U3.67A U5.E10
RX1_EN; U1.28 U1.28A U5.D2
RX1_ENB; U1.66 U1.66A U5.D3
RX2_EN; U3.28 U3.28A U5.D7
RX2_ENB; U3.66 U3.66A U5.D8
TX1_EN; U2.28 U2.28A U5.D4
TX1_ENB; U2.66 U2.66A U5.D5
TX2 EN; U4.28 U4.28A U5.D9
TX2 ENB; U4.66 U4.66A U5.D10
VCC_1; C1.2 C2.2 U1.8 U1.10 U1.22 U1.42 U1.46 U1.47
    U1.51 U1.72 U1.10A, U1.22A U1.42A U1.46A U1.47A
    U1.51A U1.72A U1.8A U2.8 U2.10 U2.22, U2.42 U2.46
    U2.47 U2.51 U2.72 U2.10A U2.22A U2.42A U2.46A
    U2.47A, U2.51A U2.72A U2.8A U5.B1 U5.C1 U5.D1
    U5.E1 U5.F1
VCC_2; C3.2 C4.2 U3.8 U3.10 U3.22 U3.42 U3.46 U3.47
    U3.51 U3.72 U3.10A, U3.22A U3.42A U3.46A U3.47A
    U3.51A U3.72A U3.8A U4.8 U4.10 U4.22, U4.42 U4.46
    U4.47 U4.51 U4.72 U4.10A U4.22A U4.42A U4.46A
    U4.47A, U4.51A U4.72A U4.8A U5.B11 U5.C11 U5.D11
    U5.E11 U5.F11
$PACKAGES
$A PROPERTIES
HARD LOCATION; 'U1'
$NETS
$A PROPERTIES DIFFERENTIAL_PAIR 'DOUT8'; 'DOUT8_P' 'DOUT8_N'
DIFFERENTIAL_PAIR 'DOUT6'; 'DOUT6_P' 'DOUT6_N'
DIFFERENTIAL_PAIR 'RIN8'; 'RIN8_P' 'RIN8_N'
DIFFERENTIAL_PAIR 'RING'; 'RING6_P' 'RIN6_N'
DIFFERENTIAL_PAIR 'DOUT4'; 'DOUT4_P' 'DOUT4_N'
DIFFERENTIAL_PAIR 'DOUT2'; 'DOUT2_P' 'DOUT2_N'
DIFFERENTIAL_PAIR 'RIN4'; 'RIN4_P' 'RIN4_N'
DIFFERENTIAL_PAIR 'RIN2'; 'RIN2_P' 'RIN2_N'
DIFFERENTIAL_PAIR 'RIN1'; 'RIN1_P' 'RIN1_N'
DIFFERENTIAL_PAIR 'RIN3'; 'RIN3_P' 'RIN3_N'
DIFFERENTIAL_PAIR 'DOUT1'; 'DOUT1_P' 'DOUT1_N'
DIFFERENTIAL_PAIR 'DOUT3'; 'DOUT3_P' 'DOUT3_N'
DIFFERENTIAL_PAIR 'RIN5'; 'RIN5_P' 'RIN5_N'
DIFFERENTIAL_PAIR 'RIN7'; 'RIN7_P' 'RIN7_N'
DIFFERENTIAL_PAIR 'DOUT5'; 'DOUT5_P' 'DOUT5_N'
DIFFERENTIAL_PAIR 'DOUT7'; 'DOUT7_P' 'DOUT7_N'
IMPEDANCE RULE 'ALL:ALL:100 ohm:2%:'; 'RIN1_P' 'RIN1_N' 'RIN2_P' 'RIN2_N'
'RIN3_P' 'RIN3_N',
  'RIN4_P' 'RIN4 N' 'DOUT1_P' 'DOUT1_N' 'DOUT2_P' 'DOUT2_N',
  'DOUT3_P' 'DOUT3_N' 'DOUT4_P' 'DOUT4_N' 'RIN5_P' 'RIN5 N',
  'RING6_P' 'RIN6_N' 'RIN7_P' 'RIN7_N' 'RIN8_P' 'RIN8_N',
  'DOUT5_P' 'DOUT5_N' 'DOUT6_P' 'DOUT6_N' 'DOUT7_P' 'DOUT7_N',
  'DOUT8_P' 'DOUT8_N'
$PINS
$A PROPERTIES
CLIP_DRAWING 'CLIP_1'; U4.62 U4.59 U4.55 U4.54 U4.53 U4.52,
  U4.51A U4.51 U4.48 U4.50 U4.49 U4.48A,
  U4.47A U4.46A U4.45A U4.44 U4.43 U4.42A,
  U4.41 U4.40 U4.39 U4.38 U4.42 U4.45,
  U4.47 U4.46 U4.35 U4.32 U2.62 U2.59,
  U2.55 U2.54 U2.53 U2.52 U2.51A U2.50,
  U2.49 U2.48A U2.47A U2.46A U2.45A U2.44,
  U2.43 U2.42A U2.41 U2.40 U2.39 U2.51,
  U2.42 U2.45 U2.48 U2.47 U2.46 U2.38,
  U2.35 U2.32 U4.69 U4.68 U4.67 U4.64,
  U4.63 U4.66 U4.74 U4.5A U4.4 U4.3,
  U4.2 U4.1 U4.73 U4.72A U4.71 U4.70,
  U4.69A U4.68A U4.67A U4.66A U4.65 U4.64A,
  U4.63A U4.62A U4.61 U4.60 U4.59A U4.58,
  U4.57 U4.56 U4.20 U4.19 U4.18 U4.17,
  U4.16 U4.15 U4.14A U4.13 U4.12 U4.11A,
  U4.10A U4.9A U4.8A U4.7 U4.6 U4.37,
  U4.36 U4.35A U4.34 U4.33 U4.32A U4.31A,
  U4.30A U4.29 U4.28A U4.27A U4.26A U4.25A,
  U4.24 U4.23 U4.22A U4.21 U4.25 U4.26,
  U4.27 U4.31 U4.30 U4.28 U2.69 U2.68,
  U2.67 U2.64 U2.63 U2.66 U2.74 U2.17,
  U2.16 U2.15 U2.14 U2.13 U2.12 U2.11A,
  U2.10A U2.9A U2.8A U2.7 U2.6 U2.5A,
  U2.4 U2.3 U2.2 U2.1 U2.73 U2.72A,
  U2.71 U2.70 U2.69A U2.68A U2.67A U2.66A,
  U2.65 U2.64A U2.63A U2.62A U2.61 U2.60,
  U2.59A U2.58 U2.57 U2.56 U2.20 U2.19,
  U2.18 U2.37 U2.36 U2.35A U2.34 U2.33,
  U2.32A U2.31A U2.30A U2.29 U2.28A U2.27A,
  U2.26A U2.25A U2.24 U2.23 U2.22A U2.21,
  U2.25 U2.26 U2.27 U2.31 U2.30 U2.28,
  U4.72 U4.5 U3.51 U4.14 U4.9 U4.11,
  U4.8 U4.10 U4.22 U2.72 U2.5 U2.14,
  U2.9 U2.11 U2.8 U2.10 U1.51 U2.22,
  U3.63 U3.62 U3.59 U3.60 U3.59A U3.58,
  U3.57 U3.56 U3.55 U3.54 U3.53 U3.52,
  U3.51A U3.48 U3.50 U3.49 U3.48A U3.47A,
  U3.46A U3.45A U3.44 U3.43 U3.42A U3.41,
  U3.40 U3.39 U3.38 U3.37 U3.36 U3.35A,
  U3.34 U3.42 U3.45 U3.47 U3.46 U3.35,
  U3.32 U3.31 U1.63 U1.62 U1.59 U1.60,
  U1.59A U1.58 U1.57 U1.56 U1.55 U1.54,
  U1.53 U1.52 U1.51A U1.50 U1.49 U1.48A,
  U1.47A U1.46A U1.45A U1.44 U1.43 U1.42A,
  U1.41 U1.40 U1.39 U1.42 U1.45 U1.48,
  U1.47 U1.46 U1.38 U1.37 U1.36 U1.35A,
  U1.34 U1.35 U1.32 U1.31 U3.72 U3.69,
  U3.68 U3.67 U3.64 U3.66 U3.74 U3.5A,
  U3.4 U3.3 U3.2 U3.1 U3.73 U3.72A,
  U3.71 U3.70 U3.69A U3.68A U3.67A U3.66A,
  U3.65 U3.64A U3.63A U3.62A U3.61 U3.20,
  U3.19 U3.18 U3.17 U3.16 U3.15 U3.14A,
  U3.13 U3.12 U3.11A U3.10A U3.9A U3.8A,
  U3.7 U3.6 U3.33 U3.32A U3.31A U3.30A,
  U3.29 U3.28A U3.27A U3.26A U3.25A U3.24,
  U3.23 U3.22A U3.21 U3.22 U3.25 U3.26,
  U3.27 U3.30 U3.28 U1.72 U1.69 U1.68,
  U1.67 U1.64 U1.66 U1.74 U1.17 U1.16,
  U1.15 U1.14A U1.13 U1.12 U1.11A U1.10A,
  U1.9A U1.8A U1.7 U1.6 U1.5A U1.4,
  U1.3 U1.2 U1.1 U1.73 U1.72A U1.71,
  U1.70 U1.69A U1.68A U1.67A U1.66A U1.65,
  U1.64A U1.63A U1.62A U1.61 U1.20 U1.19,
  U1.18 U1.33 U1.32A U1.31A U1.30A U1.29,
  U1.28A U1.27A U1.26A U1.25A U1.24 U1.23,
  U1.22A U1.21 U1.22 U1.25 U1.26 U1.27,
  U1.30 U1.28 U3.5 U3.8 U3.14 U3.9,
  U3.11 U3.10 U1.5 U1.14 U1.9 U1.11,
  U1.8 U1.10
$END

3. Fabrication Example

FIG. 5 illustrates an example parts list for fabrication of the LVDS device.

Figure 6:
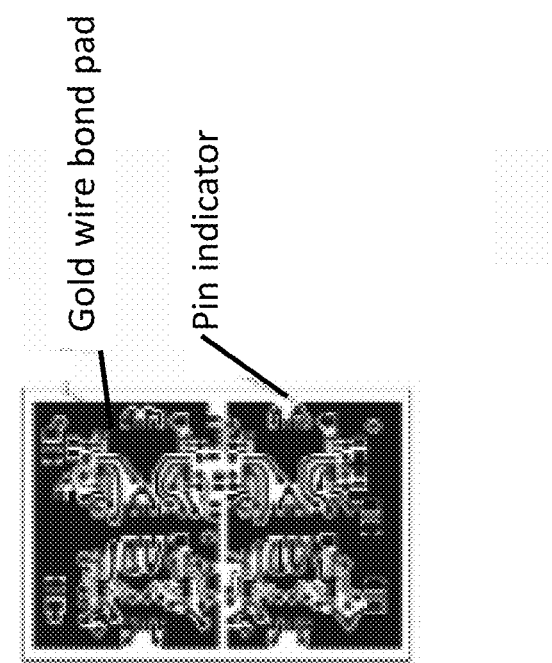
FIG. 6 illustrates substrate (PWB) details according to one or more embodiments.

FIG. 6 illustrates substrate (PWB) details (mechanical characteristics) and FIG. 7 illustrates substrate fabrication. The PWB comprises an advanced organic material technology—"CoreEZ®" (polyimide epoxy-based with silica particle fill) and the dies are wire bonded to the PWB.

The PWB comprises an organic material (polyimide) and the dies are wire bonded to the PWB.

Figure 8:
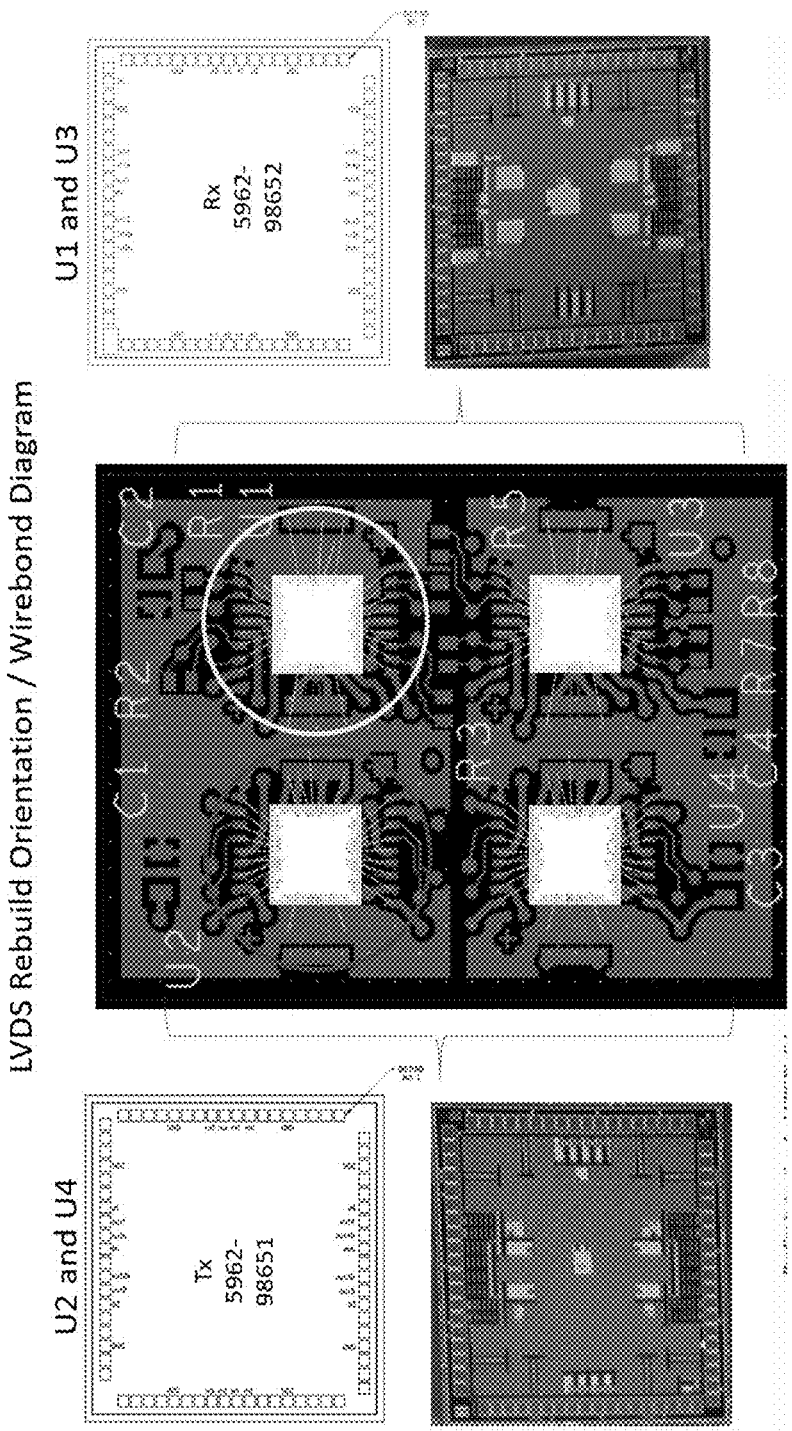
FIG. 8 is a wire bond diagram, according to one or more embodiments.

FIG. 8 illustrates a wirebond diagram with die orientation. The dies 102, 104 comprise bare chips attached and electrically connected directly to the PWB using wire bonding 800 to the inputs and the outputs. The dies are attached to the PWB using an epoxy adhesive comprising Ablestik 84-3 (cure schedule: 2 hrs at 125° C.). The discrete parts (capacitors and resistors) are attached to the PWB using Ablestik XCE3104XL (cure schedule: 15 min at 125° C.).

Figure 9A:
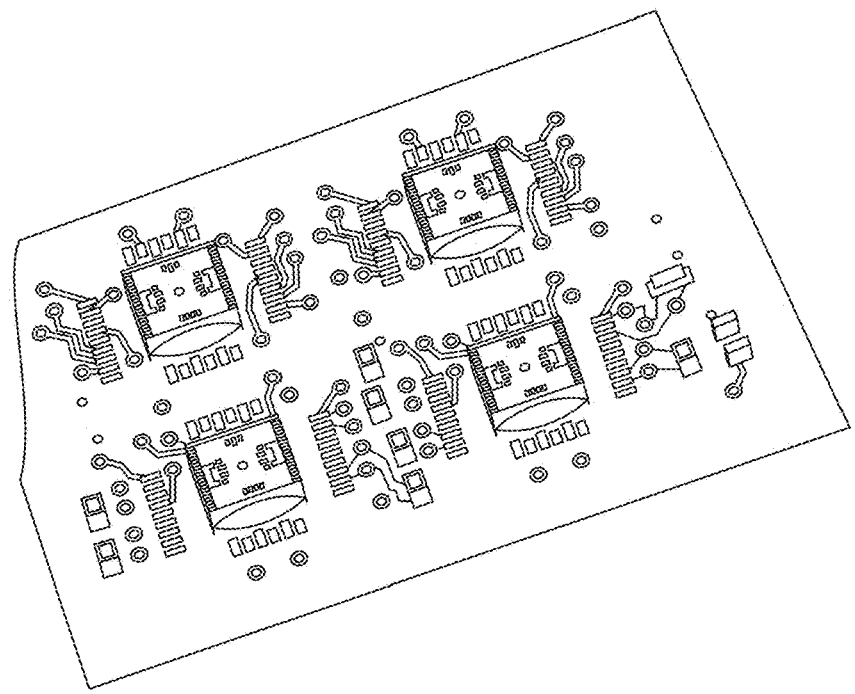
FIG. 9A shows a perspective view of a dam-and-fill (pre-potted) assembled LVDS device and FIG. 9B shows a top view of the assembled LVDS device, according to one or more examples.
Figure 9B:
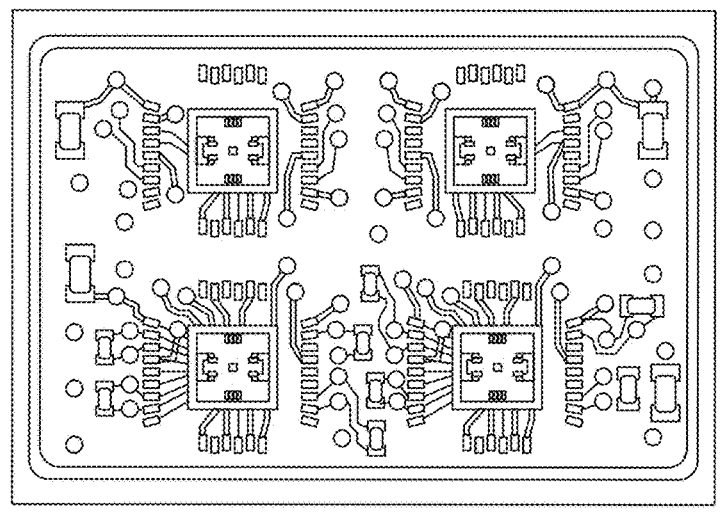
Figure 9C:
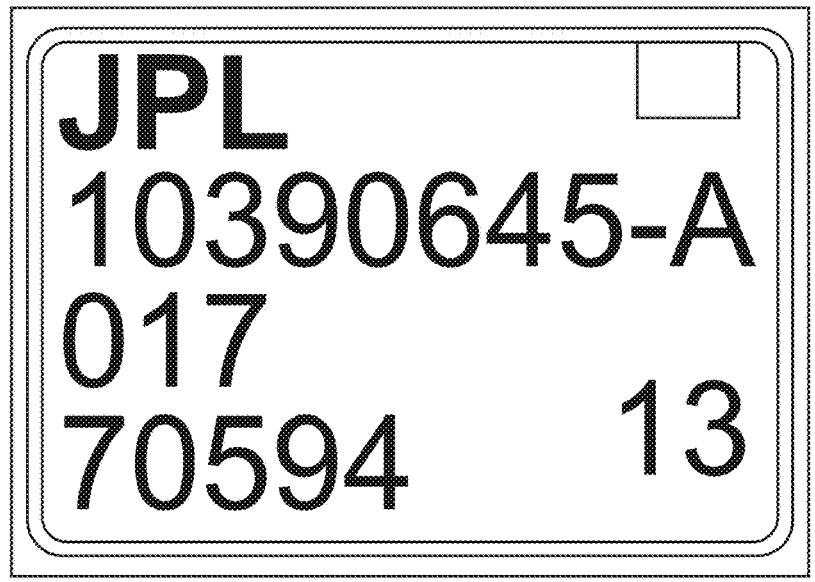
FIG. 9C shows a potted device according to one or more embodiments.
Figure 9D:
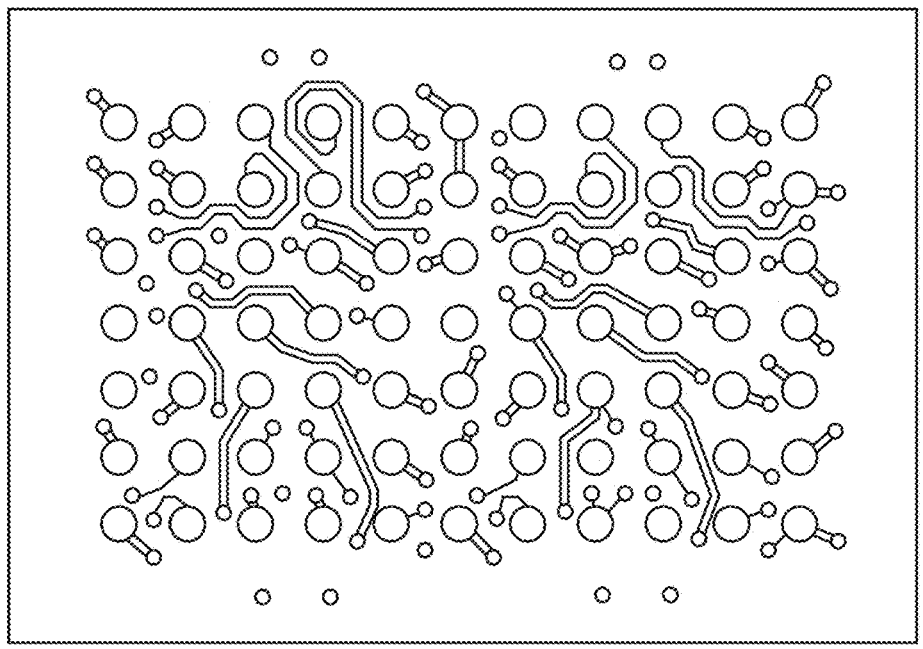
FIG. 9D shows the fabricated BGA according to one or more embodiments.

FIGS. 9A-9B illustrates the resulting LVDS device before over potting (unpotted), showing the device platform combines two complementary metal oxide semiconductor (CMOS) quad LVDS drivers and two quad LVDS receiver bare die onto a small, multi-signaled, multi-layered organic PWB, along with the associated decoupling capacitors and termination resistors for each die. FIG. 9C shows the die side of the PWB after over potting (damn and fill) with Hysol FP4401 (cure schedule: 6 hrs at 150° C.), and FIG. 9D shows the underside of the PWB with the BGA. This PWB incorporates standard tin/lead 0.6-mm diameter balls on a 1.27-mm grid array that provides for conventional surface-mount attach process to a larger circuit card assembly (CCA).

FIG. 1 and FIG. 3 further shows changes in wiring direction D from each output 112, 120 and each input 110, 118 to a ball 300 on the BGA can be minimized if desired (e.g., wiring from each output and each input to a ball on the BGA includes no more than two changes in direction D).

4. Example Figures of Merit

In one or more examples fabricated using the electrical layout of FIG. 2, the electrical characteristics of section 2, and fabrication according to section 3, the LVDS has the following characteristics.

Supply Voltage (Vcc): −0.3V to +4.0V
>400 Mbps (200 MHz) switching rates
+/−200 mV differential signaling
0.3 ns maximum differential skew (Driver)
2.5 ns maximum propagation delay (Driver)
0.2 ns maximum differential skew (Receiver))
2.5 ns maximum propagation delay (Receiver)
Compatible with IEEE 1596.3 SCI LVDS Std
Integrated 100 ohm termination resistors
1MRAD Tolerant
12 mm×17 mm compact size
Storage temperature as low as −180 C
Operating: −65° C. to +125° C.
Aeroflex 3 volt LVDS Quad CMOS Differential Line Driver
Aeroflex 3 volt LVDS Quad CMOS Differential Line receiver.

Figure 10:
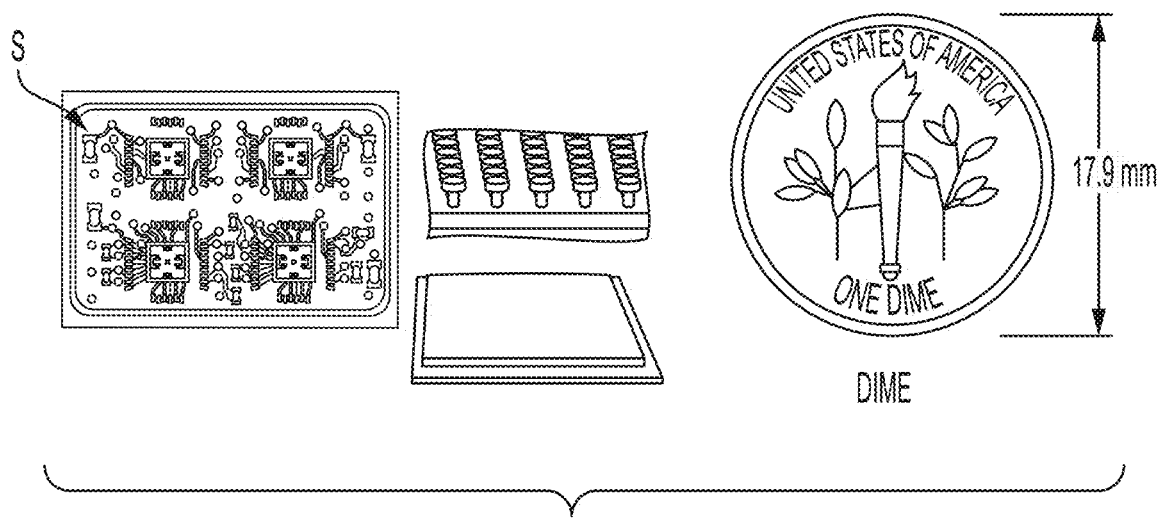
FIG. 10 shows the LVDS device size according to one or more embodiments.
Figure 11:
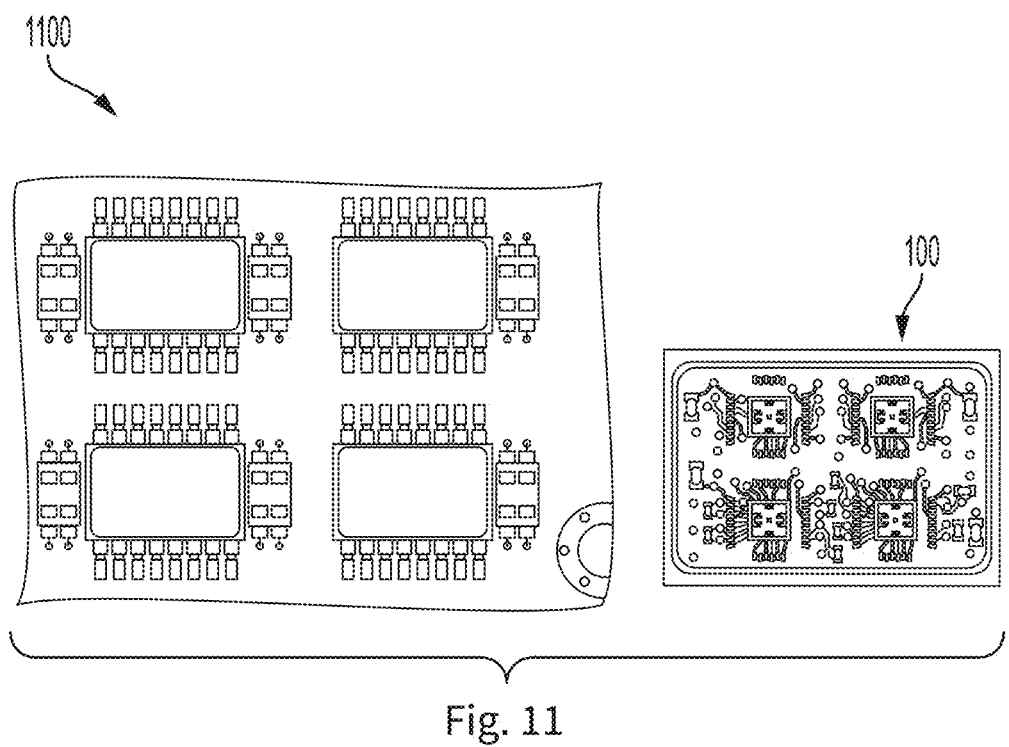
FIG. 11 compares the size of a conventional device with the LVDS device according to one or more embodiments.

The single, 77-pin BGA electronic device using state-of-the-art electronic solutions provides for a 6:1 improvement in density, achieving significant reduction in PWB layout area for more circuit functionality. FIG. 10 shows the PWB including the dies has a surface area S of 300 mm² or less. FIG. 11 shows the LVDS device according to the present invention 100 is at least 6 times smaller than an LVDS device 1100 wherein the LVDS driver and LVDS receiver are on separate printed wiring boards.

Fabricating the LVDS electronics with Chip On Board technology (bare-die attach and gold Wirebond processing) and an organic substrate allows the LVDS to survive the ambient environment of the Europa or Lunar surface without the need for survival heaters.

5. Example Application Circuits

Figure 12A:
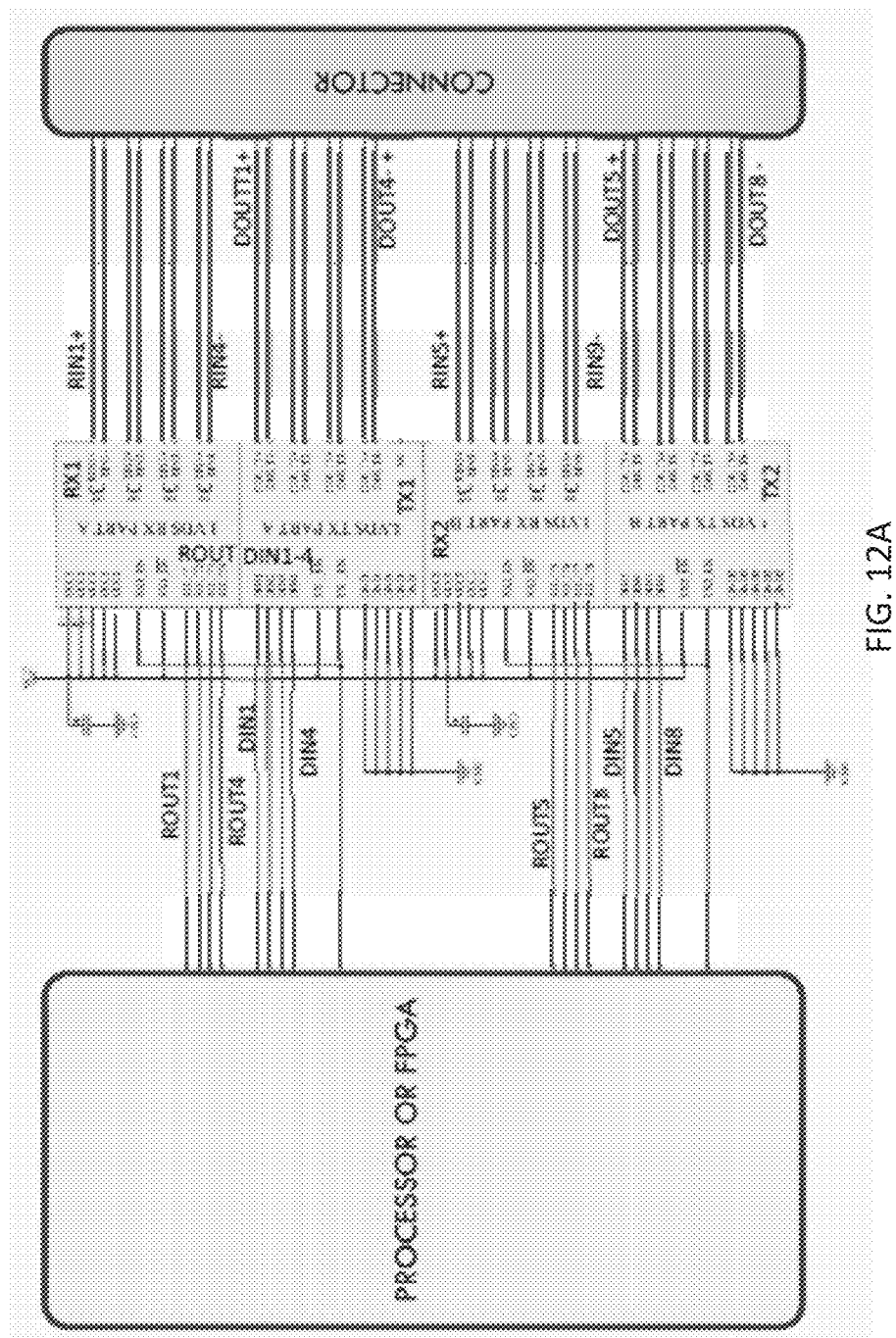
FIG. 12A illustrates an electronic circuit application including a processor and a connector connected to the LVDS device according to one or more embodiments.

FIG. 12A illustrates a circuit comprising the LVDS device, comprising a processor (e.g., FPGA) and a connector connected to the LVDS device; wherein single ended signals are routed between the dies and the processor; and differential signals are routed between the dies and the connector. In one or more examples, the recommended operating conditions include a temperature in a range of −65° C. to +125° C., an operating voltage range of 3 to 3.6 V, and a receiver input voltage of ground to 3 V.

Figure 12B:
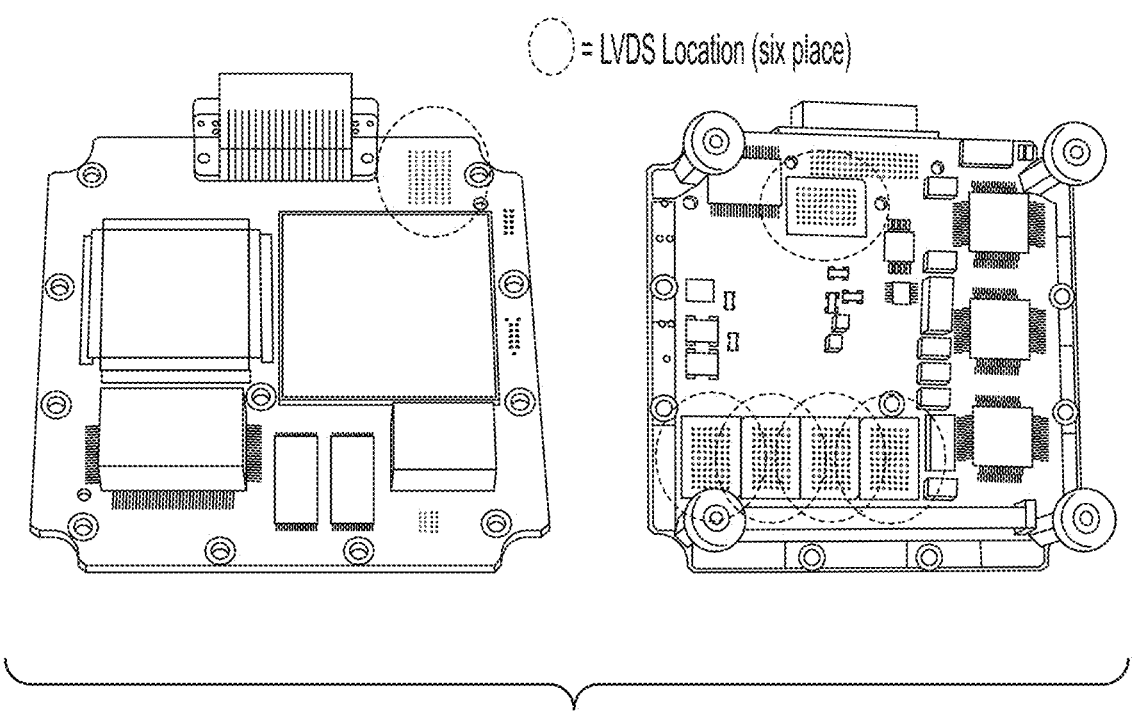
FIG. 12B illustrates a processor for the motor controller electronics including the LVDS device application according to one or more embodiments.

FIG. 12B illustrates a motor controller processor comprising the LVDS device (e.g., for a Europa lander).

Figure 13:
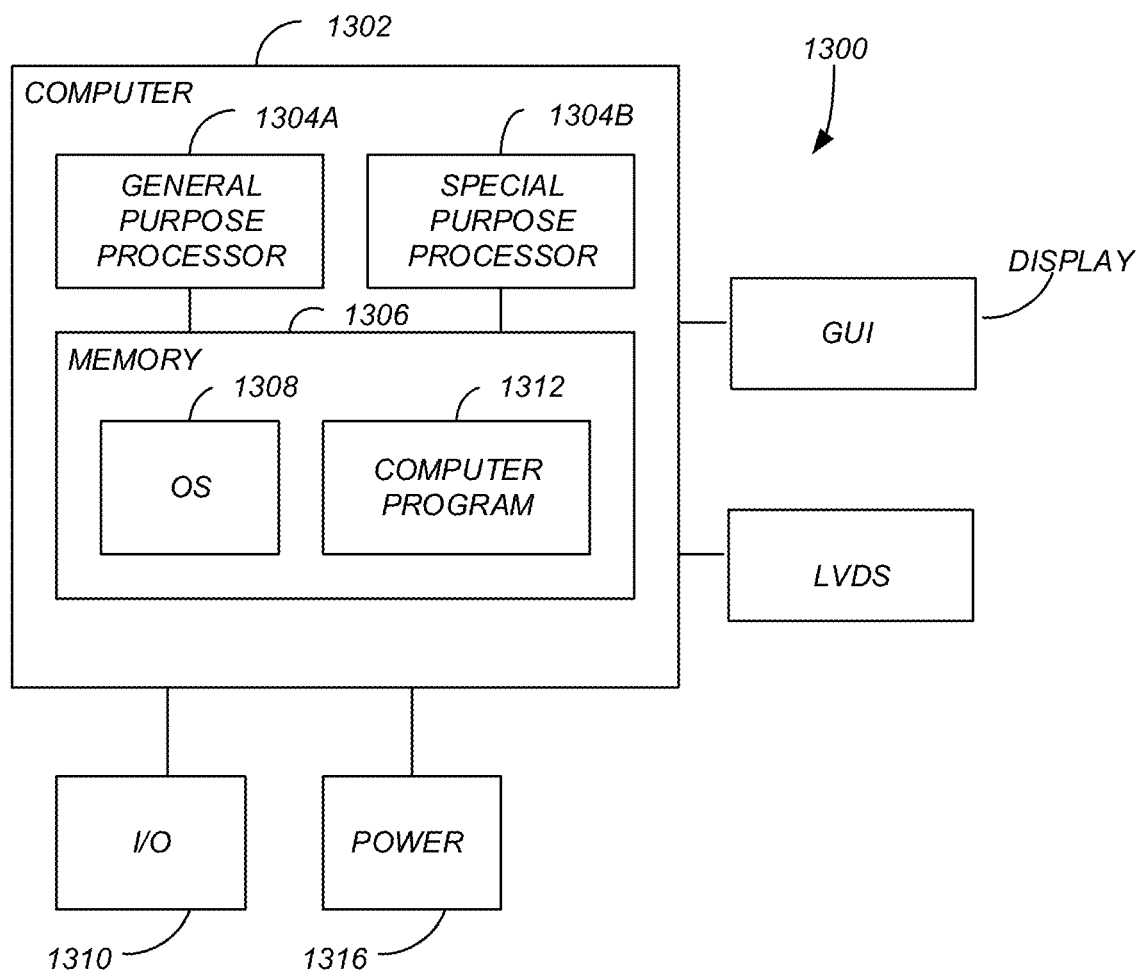
FIG. 13 illustrates a hardware environment comprising or connected to the LVDS according to one or more examples.

FIG. 13 illustrates a general computer 1302 or other device comprising or connected to the LVDS device. The computer/device 1302 comprises a processor 1304 (general purpose processor 1304A and special purpose processor 1304B) and a memory, such as random access memory (RAM) 1306. Generally, the computer 1302 operates under control of an operating system 1308 stored in the memory 1306, and interfaces with the user/other computers to accept inputs and commands and to present results through an input/output (I/O) module 1310. The computer program application 1312 accesses and manipulates data stored in the memory 1306 of the computer 1302. The operating system 1308 and the computer program 1312 are comprised of instructions which, when read and executed by the computer 1302, cause the computer 1302 to perform the operations and/or methods herein described. In one embodiment, instructions implementing the operating system 1308 and the computer program 1312 are tangibly embodied in the memory 1306, thereby making one or more computer program products or articles of manufacture capable of operating the LVDS. As such, the terms "article of manufacture," "program storage device" and "computer program product" as used herein are intended to encompass a computer program accessible from any computer readable device or media. In one embodiment, the special purpose processor 1304B is an application specific integrated circuit (ASIC). In one or more embodiments, computer 1302 may be coupled to, or may comprise, a personal computer (e.g., desktop computer (e.g., HP Compaq™), portable or media viewing/listening device (e.g., cellular/mobile device/phone, smartphone, laptop, tablet, notebook personal digital assistant, etc.) or integrated circuit, chip, or field programmable gate array (FPGA). In yet another embodiment, the computer 1302 may comprise a multi-touch device, gaming system, or other internet enabled device executing on various platforms and operating systems. In other examples, the computer comprises an LCD-TV, automotive infotainment system, industrial camera, or machine vision system. Yet further examples include a high-speed video card, graphics card, video camera data transfer card, or general purpose computer bus connected to or including the LVDS device.

Those skilled in the art will recognize many modifications may be made to this configuration without departing from the scope of the present disclosure. For example, those skilled in the art will recognize that any combination of the above components, or any number of different components, peripherals, and other devices, may be used.

Figure 14:
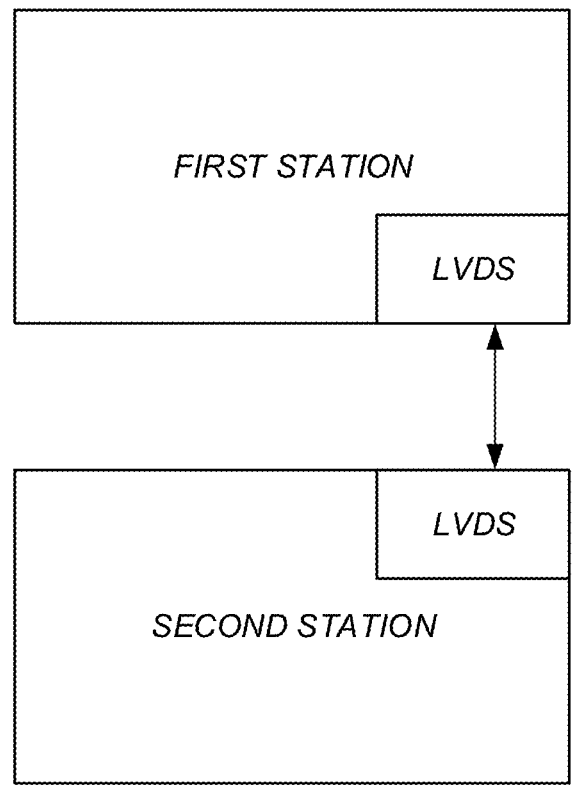
FIG. 14 illustrates a data link connected to/comprising the LVDS according to one or more examples.

FIG. 14 illustrates a data link comprising a first station and a second station, the first and second station each including the LVDS device for transmitting and receiving signals being communicated between the stations.

6. Advantages and Improvements

Current state-of-the-art LVDS devices in the aerospace market have three limitations:
driver and receiver functionalities in two separate physical packages, and have no more than 4 communication channels in each package;
have pin configurations that complicate routing of signals to the part;
require external resistors and capacitors outside the package for proper operation, which consume additional board space.

Embodiments of The LVDS device described herein are novel at least in the sense that they overcomes all three of the above limitations in the current state-of-the-art:

driver and receiver functionalities are integrated in the same package;

signals are routed from the individual driver and receiver elements inside the package such that all inputs are one side of the package, and all outputs are on the opposite side of the package, allowing for an optimized signal flow through the package;

all required capacitors and resistors are integrated inside the package; no external electronic components are required; and all of the above novelties also contribute to a possible 6:1 reduction in size compared to current state-of-the-art, for the same number of communication channels.

Moreover, exemplary embodiments of the present invention have packaging topology adapted for use in extreme environments. One key to achieving the high density of an exemplary LVDS module described herein is to leverage Applicant's expertise in cold capable electronics packaging with state-of-the-art high-density multi-chip-module (MCM) technology to achieve mass and volume improvements over heritage motor control cards. As a result, module operational temperature is in a range of −55° C. to +100° C. (validated through functional testing); storage temperature as low as −184° C. (validated thru thermal cycling for −184° C. to +85° C. for 100 thermal cycles) can be achieved; and materials and process are constant with storage temperature allowables.

Device Embodiments

As illustrated and described herein, the LVDS can be embodied in many ways including, but not limited to, the following.

1. An LVDS device, comprising a printed wiring board (PWB); a first die on the PWB; and a second die on the PWB. The first die comprises an LVDS driver circuit, the first die having a first side opposite a second side; all inputs to the LVDS driver circuit on the first side of the first die; and all outputs from the LVDS driver circuit on the second side of the first die; The second die comprises an LVDS receiver circuit, the second die having:
a first side opposite a second side; all inputs to the LVDS receiver circuit on the first side of the second die; and all outputs from the LVDS receiver circuit on the second side of the second die.

2. The device of embodiment 1, wherein all capacitors and resistors required for operation of each of the dies are on the PWB.

3. The device of embodiment 2, wherein the capacitors include decoupling capacitors and the resistors include termination resistors.

4. The device of one or any combination of the embodiments 1-3, wherein the PWB comprises an advanced organic material technology and the dies are wire bonded to the PWB.

5. The device of one or any combination of the embodiments 1-4, wherein the dies comprise bare chips attached and electrically connected directly to the PWB using wire bonding to the inputs and the outputs.

6. The device of one or any combination of the embodiments 1-5, further comprising a Ball Grid Array (BGA) electrically connected to the inputs and the outputs, wherein the dies are on a first surface of the PWB; and the BGA is on a second surface of the PWB opposite the first surface and signals are transmitted to/from the inputs and outputs and on or off the LVDS device through the BGA.

7. The device of embodiment 6, wherein wiring from each output and each input to a ball on the BGA includes no more than two changes in direction.

8. The device of one or any combination of embodiments 6-7, wherein changes in direction from each output and each input to a ball on the BGA are minimized.

9. The device of one or any combination of embodiments 1-8, wherein the LVDS device is operational at a temperature between −55° C. to +100° C., after storage at a temperature as low as −184° C., and after thermal cycling for 100 cycles between −184° C. to +85° C.

10. A circuit comprising the LVDS device of one or any combination of the embodiments 1-9, comprising a processor and a connector connected to the LVDS device; wherein single ended signals are routed between the dies and the processor; and differential signals are routed between the dies and the connector.

11. The circuit of embodiment 10, wherein the processor comprises a field programmable gate array (FPGA).

12. The LVDS device of one or any combination of embodiments 1-11, wherein the first die and the second die are connected so as to form a pair, the LVDS device further comprising a plurality of the pairs.

13. The LVDS device of embodiment 12, wherein VCC and Ground connects the dies in each pair so that the VCC for each die in the pair are connected together to the same potential and the ground for each die in the pair are connected together to the same potential.

14. The LVDS device of one or any combination of the embodiments 1-13 including two pairs, wherein each die has four inputs and four outputs and the LVDS device has 8 communication channels.

15. The LVDS device of one or any combination of the embodiments 1-14, wherein the LVDS device is at least 6 times smaller than an LVDS device wherein the LVDS driver and LVDS receiver are on separate printed wiring boards.

16. The LVDS device of one or any combination of embodiments 1-15, wherein the PWB has a surface area of 300 mm$^2$ or less.

17. A data link comprising a first station and a second station, the first and second station each including the LVDS device of one or any combination of the embodiments 1-16.

18. A device including a liquid crystal display television (LCD-TV), automotive infotainment system, industrial camera, machine vision system, notebook computer, tablet computer, mobile or cellular phone, smartphone, or other communication system comprising the LVDS of one or any combination of the embodiments 1-17. In one or more examples, the LVDS is used for communication in the device.

19. A high-speed video card, graphics card, video camera data transfer card, or general purpose computer bus connected to or including the LVDS of one or any combination of the embodiments 1-18.

20. The LVDS of one or any combination of the embodiments 1-19, wherein the LVDS device is radiation tolerant up to at least 300 kilorad (kRad).

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A Low Voltage Differential Signaling (LVDS) device, comprising:
   a printed wiring board (PWB);
   a first die on the PWB, the first die comprising an LVDS driver circuit, the first die having:
      a first side opposite a second side;
      all inputs to the LVDS driver circuit on the first side of the first die; and
      all outputs from the LVDS driver circuit on the second side of the first die; and
   a second die on the PWB, the second die comprising an LVDS receiver circuit, the second die having:
      a first side opposite a second side;
      all inputs to the LVDS receiver circuit on the first side of the second die; and
      all outputs from the LVDS receiver circuit on the second side of the second die; and
   a Ball Grid Array (BGA) electrically connected to the inputs and the outputs, wherein:
      the dies are on a first surface of the PWB; and
      the BGA is on a second surface of the PWB opposite the first surface and signals are transmitted to/from the inputs and outputs and on or off the LVDS device through the BGA, and
      wiring from each output and each input to a ball on the BGA includes no more than two changes in direction.

2. The device of claim 1, wherein changes in direction from each output and each input to a ball on the BGA are minimized.

3. The device of claim 1, wherein the LVDS device is operational:
   at a temperature between −55° C. to +100° C.,
   after storage at a temperature as low as −184° C., and
   after thermal cycling for 100 cycles between −184° C. to +85° C.

4. A computer, a display, a television, an automotive infotainment system, a camera, a machine vision system, a notebook computer, a tablet computer, a mobile or cellular phone, smartphone, or other communication system comprising the LVDS device of claim 1.

5. A high-speed video card, graphics card, video camera data transfer card, or general purpose computer bus connected to or including the LVDS device of claim 1.

6. A circuit, comprising:
   a Low Voltage Differential Signaling (LVDS) device, comprising:
   a printed wiring board (PWB);
   a first die on the PWB, the first die comprising an LVDS driver circuit, the first die having:
      a first side opposite a second side;
      all inputs to the LVDS driver circuit on the first side of the first die; and
      all outputs from the LVDS driver circuit on the second side of the first die; and
   a second die on the PWB, the second die comprising an LVDS receiver circuit, the second die having:
      a first side opposite a second side;
      all inputs to the LVDS receiver circuit on the first side of the second die; and
      all outputs from the LVDS receiver circuit on the second side of the second die; and
   a processor and a connector connected to the LVDS device; wherein:
      single ended signals are routed between the dies and the processor; and
      differential signals are routed between the dies and the connector.

7. The circuit of claim 6, wherein all capacitors and resistors required for operation of each of the dies are on the PWB.

8. The circuit of claim 7, wherein the capacitors include decoupling capacitors and the resistors include termination resistors.

9. The circuit of claim 8, wherein the PWB comprises an advanced organic material technology and the dies are wire bonded to the PWB.

10. The circuit of claim 9, wherein the dies comprise bare chips attached and electrically connected directly to the PWB using wire bonding to the inputs and the outputs.

11. The circuit of claim 6, wherein the processor comprises a field programmable gate array (FPGA).

12. The circuit of claim 6, wherein the first die and the second die are connected so as to form a pair, the circuit further comprising a plurality of the pairs.

13. The circuit of claim 12, wherein VCC and Ground connects the dies in each pair so that the VCC for each die in the pair are connected together to the same potential and the ground for each die in the pair are connected together to the same potential.

14. The circuit of claim 12 including two pairs, wherein each die has four inputs and four outputs and the LVDS device has 8 communication channels.

15. The circuit of claim 14, wherein the LVDS device is at least 6 times smaller than an LVDS device wherein the LVDS driver and LVDS receiver are on separate printed wiring boards.

16. The circuit of claim 6, wherein the PWB has a surface area of 300 mm$^2$ or less.

17. A data link comprising a first station and a second station, the first and second station each including the circuit of claim 6.

18. The circuit of claim 6, wherein the LVDS device is radiation tolerant up to at least 300 kilorad.

19. A computer, a video card, a graphics card, a video camera data transfer card, a computer bus, a display, a television, an automotive infotainment system, a camera, a machine vision system, a notebook computer, a tablet computer, a mobile or cellular phone, smartphone, a data link or other communication system comprising the circuit of claim 6.

* * * * *